United States Patent
Christensen et al.

(10) Patent No.: US 6,741,493 B1
(45) Date of Patent: May 25, 2004

(54) SPLIT LOCAL AND CONTINUOUS BITLINE REQUIRING FEWER WIRES

(75) Inventors: Todd Alan Christensen, Rochester, MN (US); Peter Thomas Freiburger, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 10/289,804

(22) Filed: Nov. 7, 2002

(51) Int. Cl.$^7$ ............................................. G11C 11/00
(52) U.S. Cl. .............. 365/154; 365/189.01; 365/230.06
(58) Field of Search ................................. 365/154, 156, 365/189.05, 189.01, 203, 63, 230.06, 230.08

(56) References Cited

U.S. PATENT DOCUMENTS 5,850,367 A * 12/1998 Wada et al. ........... 365/230.03
6,366,504 B1 * 4/2002 Masgonty et al. ...... 365/189.08
6,657,886 B1 * 12/2003 Adams et al. .............. 365/154

* cited by examiner

*Primary Examiner*—Gene Auduong
(74) *Attorney, Agent, or Firm*—Carr LLP; Robert M. Carwell

(57) ABSTRACT

An improved memory device has a reduced number of wires for carrying local write signals. The improved memory device includes an array of memory cells. A plurality of local true bitlines is coupled to the array of memory cells. A plurality of continuous complement bitlines is coupled to the array of memory cells. The memory device also includes a plurality of write circuits. At least one write circuit is coupled to at least one continuous complement bitline and at least one local true bitline, receives information on a data input from the continuous complement bitline, and controls the local true bitline. At least one local write line is coupled to at least two of the write circuits for providing a write enable signal to the two write circuits.

26 Claims, 3 Drawing Sheets

SPLIT LOCAL AND CONTINUOUS BITLINE REQUIRING FEWER WIRES

BACKGROUND OF THE INVENTION

1. Field of the Invention

The invention relates generally to a static random access memory (SRAM) and, more particularly, to an SRAM with a reduced number of wires for write circuitry in the SRAM.

2. Description of the Related Art

Static random access memories (SRAMs), in general, and high-performance domino SRAMs, in particular, are well known in the art. An SRAM device generally has an array of SRAM cells coupled to true and complement bitlines as well as wordlines. When a wordline is asserted, SRAM cells coupled to the asserted wordline are ready for either a read or write operation. When a wordline is deasserted, SRAM cells coupled to the deasserted wordline are holding the data bits stored in the cells in a previous clock cycle.

Typically, a conventional SRAM device has a plurality of write circuits and a plurality of write predriver circuits for writing write data input to a selected number of SRAM cells in the SRAM device. A write predriver circuit generally receives the write enable signal and write data input. The write predriver circuit is also coupled to a corresponding write circuit to activate or deactivate the write circuit depending on the values of the write enable signal and write data input.

In a prior art SRAM configuration having split local and continuous bitlines, the write data input is combined with the write enable signal to create a local write signal that runs down a one-dimensional array (i.e., a column) of SRAM cells in parallel with the bitlines. This necessitates a wire for a local write signal for every one-dimensional array of SRAM cells in parallel with the bitlines.

Therefore, a need exists for an SRAM device with a reduced number of such wires required for carrying local write signals to the write circuits.

SUMMARY OF THE INVENTION

The present invention provides an improved memory device with a reduced number of wires for carrying local write signals to write circuits of the memory device.

The memory device includes an array of memory cells. A plurality of local true bitlines is coupled to the array of memory cells. A plurality of continuous complement bitlines is coupled to the array of memory cells. The memory device also includes a plurality of write circuits. At least one write circuit is coupled to at least one continuous complement bitline and at least one local true bitline. Thus, at least one write circuit receives information on a data input from the continuous complement bitline and controls the local true bitline. At least one local write line is coupled to at least two of the write circuits for providing a write enable signal to the two write circuits.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, it will be obvious to those skilled in the art that the present invention may be practiced without such specific details. In other instances, well-known elements have been illustrated in schematic or block diagram form in order not to obscure the present invention in unnecessary detail.

Figure 1:
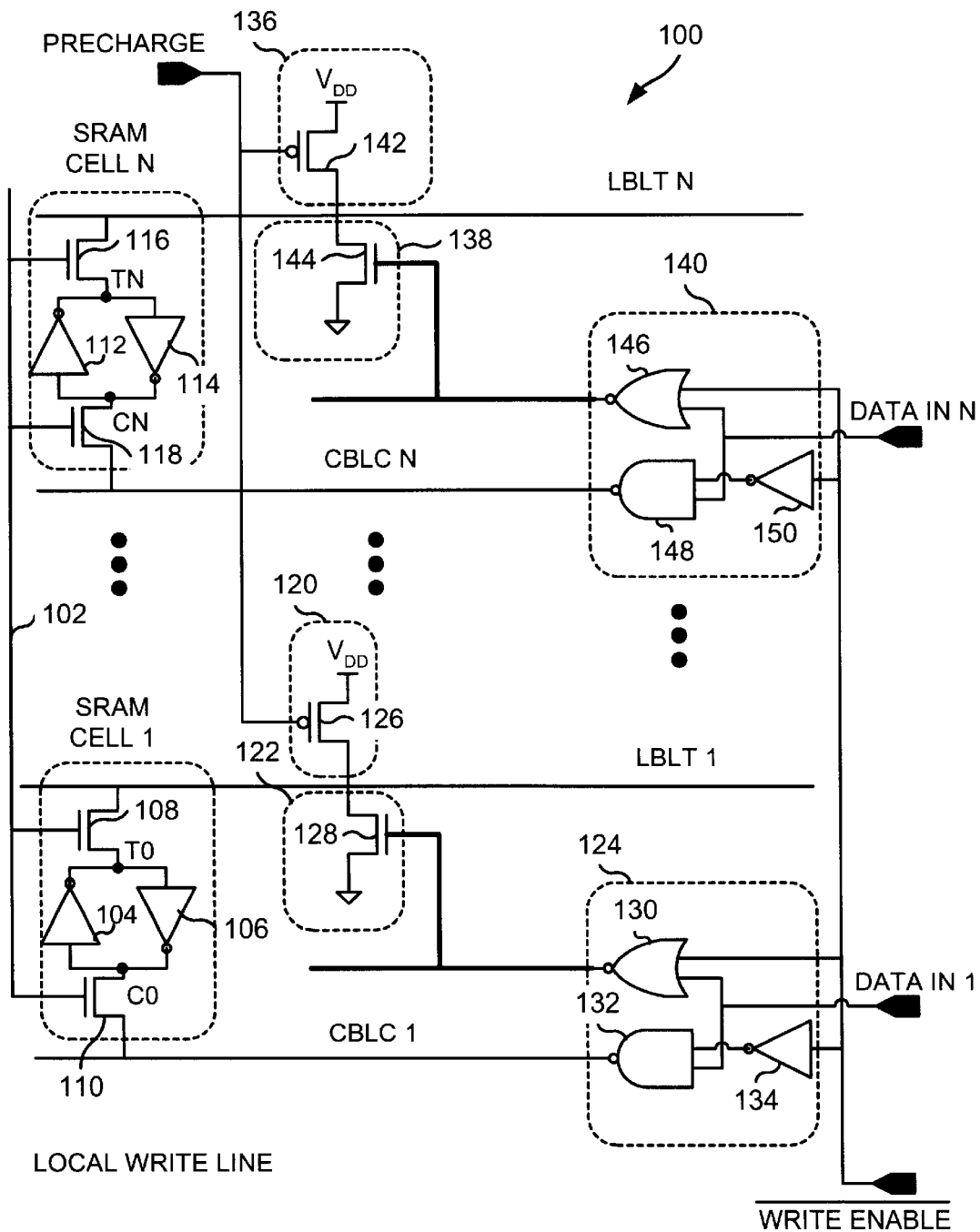
FIG. 1 is a schematic diagram illustrating a prior art static random memory (SRAM) device.

Referring to FIG. 1 of the drawings, the reference numeral 100 generally designates prior art static random memory (SRAM) device in a schematic diagram. The prior art SRAM device 100 comprises a plurality of SRAM cells including SRAM cell 1 and N, wherein N is an integer greater than or equal to 2. Note that only two SRAM cells are shown for the sake of simplicity, and that there could be additional SRAM cells in both X and Y directions.

The SRAM cell 1 is coupled to a wordline 102, a local true bitline LTBT 1, and a continuous complement bitline CBLC 1. Specifically, the SRAM cell 1 includes a pair of inverters 104 and 106 having their input and output terminals cross-connected to each other. The pair of inverters 104 and 106 operate together to store true and complement (T and C) data. A pair of wordline N-channel field effect transistors (NFETs) 108 and 110 is connected to the true and complement nodes respectively labeled T1 and C1 of the inverters 104 and 106. The wordline 102 provides the gate input to wordline NFETs 108 and 110 to perform a read or write operation to the SRAM cell 1. The local true bitline LBLT 1 is coupled to the NFET 108, whereas the continuous complement bitline CBLC 1 is coupled to the NFET 110.

Similarly, the SRAM cell N is coupled to the wordline 102, a local true bitline LTBT N, and a continuous complement bitline CBLC N. Specifically, the SRAM cell N includes a pair of inverters 112 and 114 having their input and output terminals cross-connected to each other. The pair of inverters 112 and 114 operates together to store true and complement (T and C) data. A pair of wordline N-channel field effect transistors (NFETs) 116 and 118 is connected to the true and complement nodes respectively labeled TN and CN of the inverters 112 and 114. The wordline 102 provides the gate input to wordline NFETs 116 and 118 to perform a read or write operation to the SRAM cell N. The local true bitline LBLT N is coupled to the NFET 116, whereas the continuous complement bitline CBLC N is coupled to the NFET 118.

The prior art SRAM device 100 also includes a precharge circuit 120, a write circuit 122, and a write predriver circuit 124. The write predriver circuit 124 receives data input DATA IN 1 and an inverted write enable signal and is coupled to the write circuit 122 via a WRITE T1 line to provide a local write signal to the write circuit 122. The write predriver circuit 124 is also coupled to the continuous complement bitline CBLC 1.

Specifically, the precharge circuit 120 includes a P-channel field effect transistor (PFET) 126 with a gate terminal coupled to a precharge signal, a source terminal coupled to a voltage source Vdd, and a drain terminal coupled to the local true bitline LBLT 1. The write circuit 122 includes an NFET 128 with a drain terminal coupled to the local true bitline LBLT 1, a gate terminal coupled to the WRITE T1 line, and a source terminal coupled to ground. The write predriver circuit 124 includes a NOR gate 130, a NAND gate 132, and an inverter 134. The NOR gate 130 receives the inverted write enable signal and the data input DATA IN 1. The NAND gate 132 is coupled to the inverter 134 to receive a write enable signal and also receives the data input DATA IN 1.

Similarly, the prior art SRAM device 100 includes a precharge circuit 136, a write circuit 138, and a write predriver circuit 140. The write predriver circuit 140 receives data input DATA IN N and the inverted write enable signal and is coupled to the write circuit 138 via a WRITE TN line to provide a local write signal to the write circuit 138. The write predriver circuit 140 is also coupled to the continuous complement bitline CBLC N.

Specifically, the precharge circuit 136 includes a P-channel field effect transistor (PFET) 142 with a gate terminal coupled to the precharge signal, a source terminal coupled to the voltage source Vdd, and a drain terminal coupled to the local true bitline LBLT N. The write circuit 138 includes an NFET 144 with a drain terminal coupled to the local true bitline LBLT N, a gate terminal coupled to the WRITE TN line, and a source terminal coupled to ground. The write predriver circuit 140 includes a NOR gate 146, a NAND gate 148, and an inverter 150. The NOR gate 146 receives the inverted write enable signal and the data input DATA IN N. The NAND gate 148 is coupled to the inverter 150 to receive the write enable signal and also receives the data input DATA IN N.

Generally, the prior art SRAM device 100 may include additional SRAM cells (not shown) in both X and Y directions. Note also that the prior art SRAM device 100 may further include read circuitry (not shown) coupled to each of the local true bitlines LBLT 1-N to read a data bit stored in SRAM cells 1-N when the wordline is activated.

In the operation of the prior art SRAM device 100, when the write enable signal is low (0), then the NOR gate 130 outputs a low (0) local write signal onto the WRITE T1, regardless of the value of the data input DATA IN 1. In this case, the NAND gate 132 outputs a high (1) signal onto the continuous complement bitline CBLC 1, regardless of the value of the data input DATA IN 1.

When the write enable signal is high (1), the NOR gate 130 outputs an inverted signal of the data input DATA IN 1 onto the WRITE T1 line. In this case, the NAND gate 132 outputs an inverted signal of the data input DATA IN 1 onto the continuous complement bitline CBLC 1. This will adjust the signal value on the local true bitline LTBT 1 to reflect the value of the data input DATA IN 1, which value is written to the SRAM cell 1 when the wordline 102 is activated.

The problem with the configuration of the prior art SRAM device 100 is that a plurality of lines WRITE T1-TN is required for local write signals in parallel with bitlines such as LBLT 1-N and CBLC 1-N. In this configuration, at least one WRITE T line is required for each set of LBLT and CBLC lines.

Figure 2:
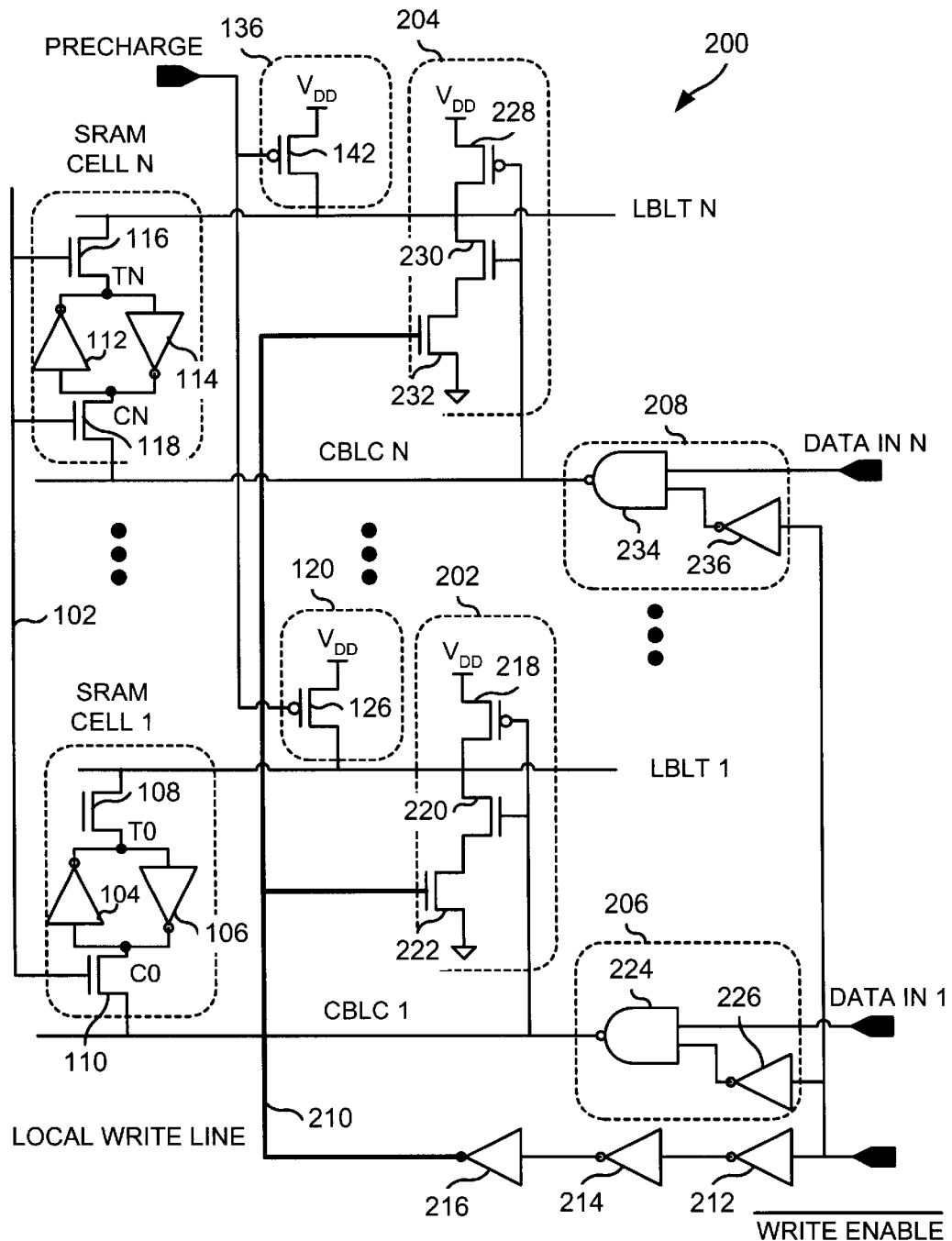
FIG. 2 is a schematic diagram illustrating an SRAM device with a reduced number of wires for local write signals.

Now referring to FIG. 2, an improved SRAM device 200 with a reduced number of wires for local write signals is shown in a schematic diagram. The improved SRAM device 200 shows the same SRAM cells 1-N as in FIG. 1. Also, the improved SRAM device 200 has the same local true bitlines LBLT 1-N and continuous complement bitlines CBLC 1-N, along with the same precharge circuits 126 and 142. The improvement is made, among other things, with respect to write circuits 202 and 204 as well as write predriver circuits 206 and 208. Also, the write enable signal is directly input to the write circuits 202 and 204 via a single local write line 210 for writing to SRAM cells 0-N. The inverted write enable signal is input to inverters 212, 214, and 216 coupled in series to output the write enable signal onto the local write line 210. These inverters 212, 214, and 216 are primarily function as buffers to delay the write enable signal to allow the continuous complement bitlines CBLC 1-N to evaluate DATA IN 1-N. Therefore, the number of such inverters may be subject to change depending on the exact delay of any related circuitry. Also, buffers (not shown) may be used instead of inverters.

Specifically, the write circuit 202 includes a PFET 218 with a source terminal coupled to the voltage source Vdd and a drain terminal coupled to the local true bitline LBLT 1. An NFET 220 is also shown with a drain terminal coupled to the local true bitline LBLT 1 and a source terminal coupled to an NFET 222. Both the PFET 218 and NFET 220 have their respective gate terminals coupled to the continuous complement bitline CBLC 1. The NFET 222 has a drain terminal coupled to the source terminal of the NFET 220, a gate terminal coupled to the local write line 210, and a source terminal coupled to ground. The write predriver circuit 206 includes a NAND gate 224 and an inverter 226. The NAND gate 224 receives the data input DATA IN 1 and is coupled to the inverter 226 to receive the write enable signal.

Similarly, the write circuit 204 includes a PFET 228 with a source terminal coupled to the voltage source Vdd and a drain terminal coupled to the local true bitline LBLT N. An NFET 230 is also shown with a drain terminal coupled to the local true bitline LBLT N and a source terminal coupled to an NFET 232. Both the PFET 228 and NFET 230 have their respective gate terminals coupled to the continuous complement bitline CBLC N. The NFET 232 has a drain terminal coupled to the source terminal of the NFET 230, a gate terminal coupled to the local write line 210, and a source terminal coupled to ground. The write predriver circuit 208 includes a NAND gate 234 and an inverter 236. The NAND gate 224 receives the data input DATA IN N and is coupled to the inverter 236 to receive the write enable signal.

Note that the present invention makes use of the fact that the data input 1-N is already present in the continuous bitlines CBLC 1-N to save having to run the WRITE T1-TN wires down every pair of bitlines LBLT 1-N and CBLC 1-N. In order words, no additional wires are required to run over SRAM cells on pitch, other than continuous complement bitlines CBLC 1-N.

The operation of the improved SRAM device has the same read operation as in the prior art SRAM device 100 of FIG. 1. During a write operation, the wordline 102 is activated as before. If a low (0) is to be written to a complement node (e.g., any of the complement nodes C1-CN), then a corresponding continuous complement bitline CBLC is pulled to a low (0), while a corresponding local true bitline LBLT is held at a high (1) by a PFET (e.g., any of the PFETs 218 and 228) tied to the continuous complement bitline CBLC. When the local write signal goes to a high (1), nothing will happen, because the local true bitline is gated off by an NFET (e.g., any of the NFETs 222 and 232) tied to the continuous complement bitline CBLC. If a low (0) is to be written to the true node of the cell, the continuous complement bitline CBLC will remain a high (1). The local write signal will then go to a high (1), and the write circuit will pull down the local true bitline LBLT, thereby writing the cell.

Figure 3:
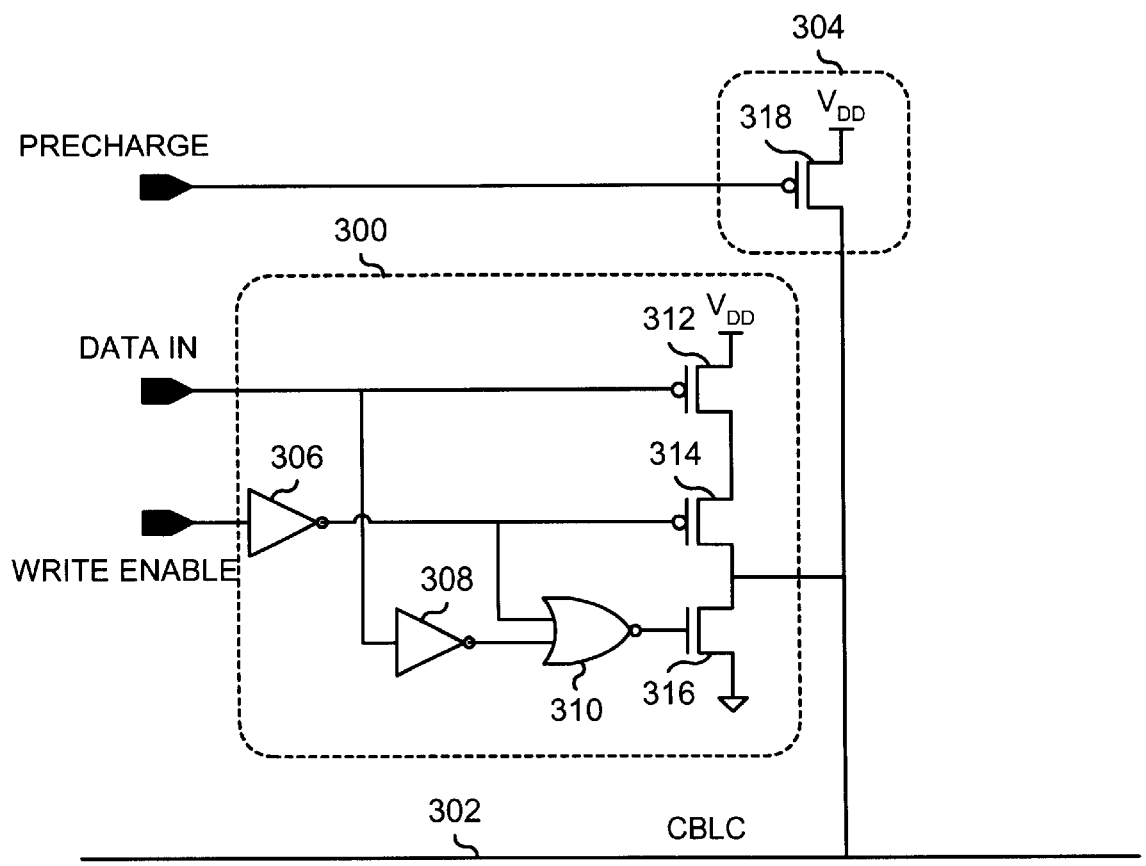
FIG. 3 is a schematic diagram illustrating an alternative embodiment of a write predriver circuit.

FIG. 3 is a schematic diagram illustrating an alternative embodiment of a write predriver circuit 300. The write predriver circuit 300 may be substituted for any of the write predriver circuits 206 and 208. The write precharge circuit 300 has the same input and output configuration as the write predriver circuits 206 and 208. The write precharge circuit 300 is coupled to a continuous complement bitline CBLC 302 such as any of the CBLC 0-N of FIG. 2. Optionally, the continuous complement bitline CBLC 302 is coupled to a precharge circuit 304.

The write precharge circuit 300 comprises inverters 306 and 308, a NOR gate 310, two PFETs 312 and 314, and an NFET 316. The inverter 306 is coupled to the PFET 314 to provide an inverted write enable signal to a gate terminal of the PFET 314. The inverter 306 is also coupled to the NOR gate 310 to provide the inverted write enable signal to an input of the NOR gate 310. The inverter 308 is coupled to the NOR gate 310 to provide an inverted signal of the data input DATA IN. The output of NOR gate 310 is coupled to the NFET 316 via a gate terminal. The PFET 312 has a source terminal coupled to the voltage source Vdd, a gate terminal coupled to the data input DATA IN, and a drain terminal coupled to the source terminal of the PFET 314. The NFET 316 has a drain terminal coupled to the source terminal of the PFET 314 and a source terminal coupled to ground. The output of the write predriver circuit 300 is taken from the drain of the PFET 314 (or the drain of the NFET 316) and is coupled to the continuous complement bitline CBLC 302.

The optional precharge circuit 304 has a PFET 318 with a source terminal coupled to the voltage source Vdd, a gate terminal coupled to the precharge signal, and a drain terminal coupled to the continuous complement bitline CBLC 302.

There is a slight difference in operation of the improved SRAM device when the write circuits 202 and 204 of FIG. 2 each are replaced with the write circuit 300 along with the optional precharge circuit 304. The difference is that the continuous complement bitlines CBLC 1-N is allowed to float, rather than be held high (1) in precharge. However, this difference does not affect the read operation, because there is no change in the local true bitlines LBLT 1-N, as mentioned above.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. A memory device comprising:
    an array of memory cells;
    a plurality of local true bitlines coupled to the array of memory cells;
    a plurality of continuous complement bitlines coupled to the array of memory cells;
    a plurality of write circuits, at least one write circuit being coupled to at least one continuous complement bitline and at least one local true bitline, and the at least one write circuit both receiving information on a data input from the at least one continuous complement bitline and controlling the at least one local true bitline; and
    at least one local write line coupled to the at least two of the write circuits for providing a write enable signal to the at least two of the write circuits.

2. The memory device of claim 1, wherein at least one of the write circuits comprises:
    a first switch coupled between a voltage source and the at least one local true bitline and controlled by the at least one continuous complement bitline; and
    a second switch coupled between the at least one local write line and ground and controlled by both the at least one continuous complement bitline and the write enable signal.

3. The memory device of claim 2, wherein the first switch is turned on when the at least one continuous complement bitline is in a low (0) state, and wherein the first switch is turned off when the at least one continuous complement bitline is in a high (1) state.

4. The memory device of claim 2, wherein the second switch is turned on when both the at least one continuous complement bitline and the write enable signal are in a high (1) state, and wherein the second switch is turned off when either the at least one continuous complement bitline or the write enable signal is in a low (1) state.

5. The memory device of claim 2, wherein the first switch comprises a P-channel field effect transistor (PFET) with a source, gate, and drain terminal, the source terminal being coupled to a voltage source, the gate terminal being coupled to the at least one continuous complement bitline, and the drain terminal being coupled to the at least one local true bitline.

6. The memory device of claim 2, wherein the second switch comprises:
    a first N-channel field effect transistor (NFET) with a drain, gate, and source terminal, the drain terminal being coupled to the at least one local true bitline, the gate terminal being coupled to the at least one continuous complement bitline; and
    a second NFET with a drain, gate, and source terminal, the drain terminal being coupled to the source terminal of the first NFET, the gate terminal being coupled to the at least one local write line, the source terminal being coupled to ground.

7. The memory device of claim 1, further comprising at least one precharge circuit coupled to the at least one local true bitline.

8. The memory device of claim 7, wherein the at least one precharge circuit comprises a switch coupled between a voltage source and the at least one local true bitline and controlled by a precharge signal.

9. The memory device of claim 8, wherein the switch comprises a P-channel field effect transistor (PFET) with a source, gate, drain terminal, the source terminal being coupled to the voltage source, the gate terminal being coupled to the precharge signal, and the drain terminal being coupled to the at least one local true bitline.

10. The memory device of claim 1, further comprising at least one write predriver circuit coupled to the at least one continuous complement bitline for providing the information on the data input onto the at least one continuous complement bitline.

11. The memory device of claim 10, wherein the at least one write predriver circuit comprises a two-input NAND gate receiving the data input and the write enable signal.

12. The memory device of claim 11, wherein the at least one write predriver circuit further comprises an inverter receiving an inverted write enable signal and coupled to the two-input NAID gate to provide the write enable signal to the two-input NAND gate.

13. The memory device of claim 10, wherein the at least one writer predriver circuit comprises:
    a first P-channel field effect transistor (PFET) with a source, gate, and drain terminal, the source terminal being coupled to a voltage source, the gate terminal being coupled to receive the data input;
    a second P-channel field effect transistor (PFET) with a source, gate, and drain terminals, the source terminal being coupled to the drain terminal of the first PFET, the gate terminal being coupled to receive an inverted write enable signal, the drain terminal being coupled to the at least one continuous complement bitline;

an NFET with a drain, gate, and source terminal, the drain terminal being coupled to the at least one continuous complement bitline, the source terminal being coupled to ground; and a two-input NOR gate coupled to receive the inverted write enable signal and an inverted data input, the two-input NOR gate having an output coupled to the gate terminal of the NFET.

14. The memory device of claim 13, wherein the at least one write predriver circuit further comprises:

a first inverter coupled to receive the data input and coupled to the two-input NOR gate to provide the inverted data input to the NOR gate; and a second inverter coupled to receive the write enable signal and coupled to the two-input NOR gate and the gate terminal of the first NFET to provide the inverted write enable signal to the two-input NOR gate and the gate terminal of the second PFET.

15. The memory device of claim 1, further comprising a buffer means coupled to the at least one local write line to delay the write enable signal in order to allow the at least one continuous complement bitline to evaluate the data input.

16. The memory device of claim 15, wherein the buffer means comprises one or more inverters coupled in series.

17. The memory device of claim 1, further comprising at least one precharge circuit coupled to the at least one continuous complement true bitline.

18. The memory device of claim 17, wherein the at least one precharge circuit comprises a switch coupled between a voltage source and the at least one continuous complement bitline and controlled by a precharge signal.

19. The memory device of claim 18, wherein the switch comprises a P-channel field effect transistor (PFET) with a source, gate, drain terminal, the source terminal being coupled to the voltage source, the gate terminal being coupled to the precharge signal, and the drain terminal being coupled to the at least one continuous complement bitline.

20. The memory device of claim 1, wherein the memory device comprises a domino static random access memory (SRAM) device.

21. A method for eliminating write circuitry lines carrying write data to write circuits in a memory device having a continuous complement bitline, comprising the steps of:

coupling a plurality of local true bitlines to the array of memory cells;

coupling a plurality of continuous complement bitlines to the array of memory cells;

coupling at least one of a plurality of write circuits to at least one continuous complement bitline and at least one local true bitline;

receiving information on a data input by the at least one write circuit from the at least one continuous complement bitline;

controlling the at least one local true bitline;

coupling at least one local write line to at least two of the write circuits; and providing a write enable signal to the at least two of the write circuits via the at least one local write line.

22. The method of claim 21, further comprising the steps of:

coupling a first switch between a voltage source and the at least one local true bitline;

controlling the first switch by the at least one continuous complement bitline;

coupling a second switch between the at least one local write line and ground; and controlling the second switch by both the at least one continuous complement bitline and the write enable signal.

23. The method of claim 22, further comprising the steps of:

turning on the first switch when the at least one continuous complement bitline is in a low (0) state; and turning off the first switch when the at least one continuous complement bitline is in a high (1) state.

24. The method of claim 22, further comprising the steps of:

turning on the second switch when both the at least one continuous complement bitline and the write enable signal are in a high (1) state; and turning off the second switch when either the at least one continuous complement bitline or the write enable signal is in a low (1) state.

25. The method of claim 21, further comprising the step of coupling at least one precharge circuit to the at least one local true bitline.

26. The method of claim 25, further comprising the steps of:

coupling a switch between a voltage source and the at least one local true bitline; and controlling the switch by a precharge signal.

* * * * *

UNITED STATES PATENT AND TRADEMARK OFFICE
CERTIFICATE OF CORRECTION

PATENT NO.    : 6,741,493 B1
DATED         : May 25, 2004
INVENTOR(S)   : Todd Alan Christensen and Peter Thomas Freiburger It is certified that error appears in the above-identified patent and that said Letters Patent is hereby corrected as shown below:

Column 6,
Line 58, delete "NAID" and insert -- NAND --

Signed and Sealed this

Twentieth Day of July, 2004

JON W. DUDAS
*Acting Director of the United States Patent and Trademark Office*